(12) United States Patent
Kobayashi et al.

(10) Patent No.: US 9,454,087 B2
(45) Date of Patent: Sep. 27, 2016

(54) EXPOSURE APPARATUS AND DEVICE FABRICATION METHOD

(71) Applicant: CANON KABUSHIKI KAISHA, Tokyo (JP)

(72) Inventors: Kenichi Kobayashi, Utsunomiya (JP); Takahito Chibana, Utsunomiya (JP); Hitoshi Nakano, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 255 days.

(21) Appl. No.: 13/863,480

(22) Filed: Apr. 16, 2013

(65) Prior Publication Data
US 2013/0293854 A1    Nov. 7, 2013

(30) Foreign Application Priority Data

May 1, 2012   (JP) ................. 2012-104881

(51) Int. Cl.
G03F 7/20        (2006.01)

(52) U.S. Cl.
CPC ....... *G03F 7/70341* (2013.01); *G03F 7/70891* (2013.01)

(58) Field of Classification Search
CPC .................. G03F 7/70341; G03F 7/70891
See application file for complete search history.

(56) References Cited

U.S. PATENT DOCUMENTS

| | | | |
|---|---|---|---|
| 8,451,423 B2 | 5/2013 | Janssen et al. | |
| 2005/0046813 A1* | 3/2005 | Streefkerk et al. | 355/30 |
| 2005/0179877 A1* | 8/2005 | Mulkens et al. | 355/30 |
| 2005/0264780 A1* | 12/2005 | Graeupner | 355/53 |
| 2006/0261288 A1* | 11/2006 | Van Santen | G03F 7/70341 250/492.1 |
| 2007/0070316 A1* | 3/2007 | Ehrmann et al. | 355/53 |
| 2007/0252960 A1* | 11/2007 | Kida | 355/30 |
| 2009/0115977 A1* | 5/2009 | Nagasaka | G03F 7/70341 355/30 |

FOREIGN PATENT DOCUMENTS

| | | |
|---|---|---|
| JP | 2005136404 A | 5/2005 |
| JP | 2005-252247 A | 9/2005 |
| JP | 2006-054468 A | 2/2006 |
| JP | 2008140959 | 6/2008 |
| JP | 2010004039 A | 1/2010 |
| JP | 2012059761 A | 3/2012 |
| WO | 2006/112436 A1 | 10/2006 |

OTHER PUBLICATIONS

Office Action issued in Japanese Appln. No. 2012-104881, mailed Feb. 26, 2016.

* cited by examiner

*Primary Examiner* — Steven H Whitesell Gordon
(74) *Attorney, Agent, or Firm* — Rossi, Kimms & McDowell LLP

(57) ABSTRACT

The present invention provides an exposure apparatus which includes a projection optical system that projects a pattern of a reticle onto a substrate, and exposes the substrate through the projection optical system and a liquid, the apparatus including a recovery unit which includes a recovery path connected to a recovery port, and is configured to reduce a pressure in the recovery path to recover the liquid, supplied to a space between the projection optical system and the substrate, through the recovery port and the recovery path, and a heating unit which is disposed in the recovery path, and configured to heat the liquid recovered through the recovery port and the recovery path.

24 Claims, 10 Drawing Sheets

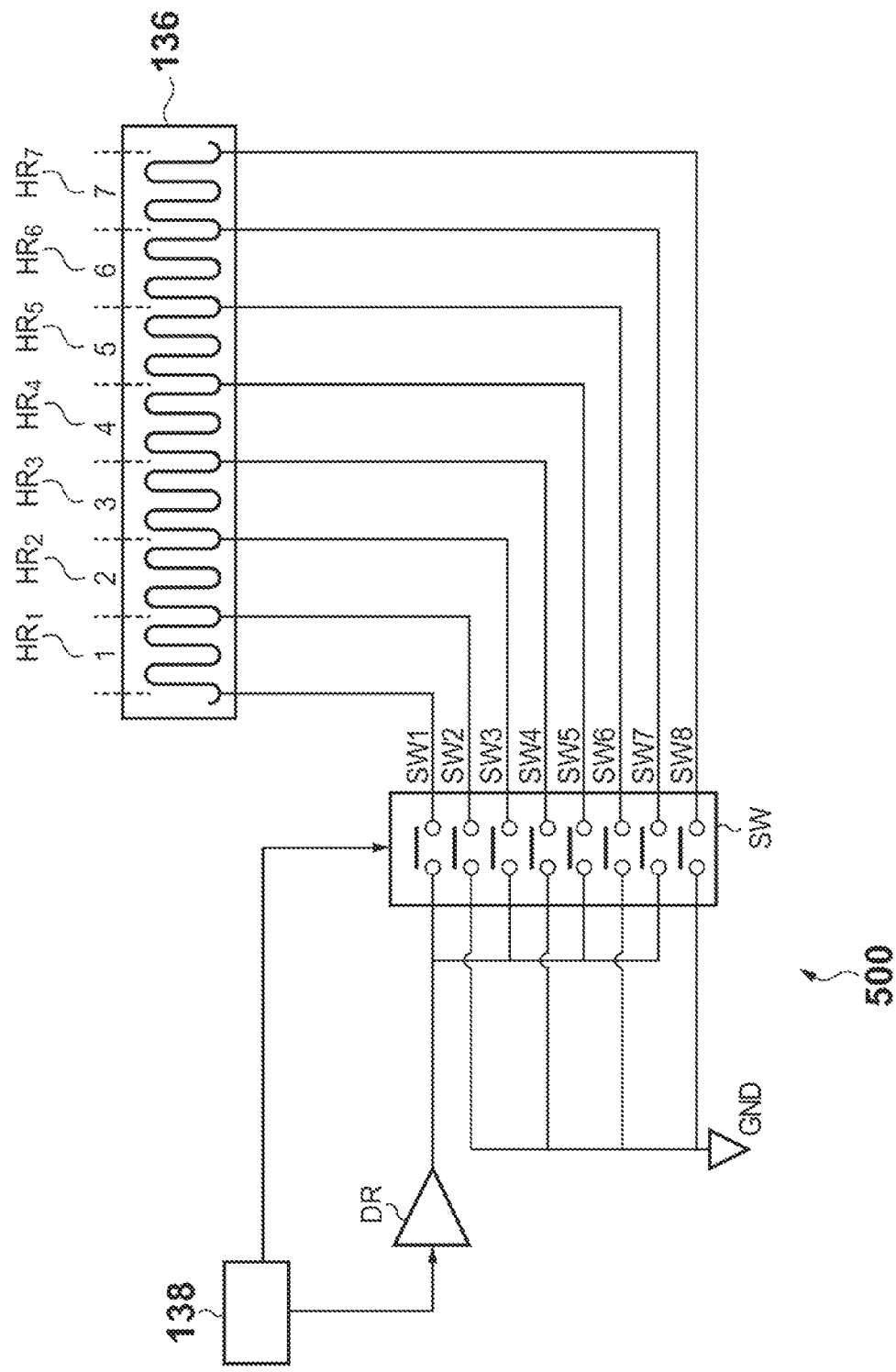

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

An exposure apparatus which projects (reduction projection) and transfers the pattern of a reticle onto a substrate coated with a resist (photosensitive agent) is employed to fabricate a fine semiconductor device such as an LSI or a VLSI. As the packing density of a semiconductor device increases, a demand has arisen for further pattern miniaturization. The resolution of an exposure apparatus improves along with the development of a resist process.

As a technique of improving the resolution of an exposure apparatus, the so-called immersion method in which the space between a substrate and the final surface (final lens) of a projection optical system is filled with a liquid is available. For example, the resolution of an exposure apparatus when the space between a substrate and the final surface of a projection optical system is filled with pure water (Refractive Index=1.44) becomes 1.44 times that when the space between the substrate and the final surface of the projection optical system is filled with a gas (air). This amounts to increasing the numerical aperture (NA) of the projection optical system to 1.44 times. With the immersion method, a resolution equivalent to an NA of 1 or more that is impossible in the conventional method can be obtained.

Roughly two methods of filling the space between the substrate and the final surface of the projection optical system with a liquid are available. In the first method, the entire substrate and the final surface of the projection optical system are accommodated in a liquid tank. The second method is the local fill method in which a liquid is supplied only to the space between the substrate and the final surface of the projection optical system.

In the immersion method, it is necessary to maintain the liquid that fills the space between the substrate and the final surface of the projection optical system at a predetermined temperature. It is also necessary to suppress cooling due to heat of vaporization generated as the liquid that fills the space between the substrate and the final surface of the projection optical system vaporizes. To meet these requirements, Japanese Patent Laid-Open Nos. 2005-252247 and 2006-054468 propose, for example, an exposure apparatus equipped with a temperature control system which controls the temperature of a member that comes into contact with the liquid, and an exposure apparatus including a substrate stage equipped with a heater.

In an exposure apparatus which adopts the local fill method, a liquid that fills the space between a substrate and the final surface of a projection optical system is recovered while the liquid is mixed with a gas (gas-liquid mixture state). In this manner, when the liquid is recovered in a gas-liquid mixture state, vaporization of the liquid is promoted, leading to a considerable decrease in temperature of a liquid recovery path. The decrease in temperature of the liquid recovery path adversely affects members arranged around the liquid recovery path, such as the projection optical system and measuring system, thus degrading the pattern transfer accuracy.

SUMMARY OF THE INVENTION

The present invention provides a technique advantageous in terms of reducing the amount of decrease in temperature of a recovery path which recovers a liquid supplied to the space between a projection optical system and a substrate.

According to one aspect of the present invention, there is provided an exposure apparatus which includes a projection optical system that projects a pattern of a reticle onto a substrate, and exposes the substrate through the projection optical system and a liquid, the apparatus including a recovery unit which includes a recovery path connected to a recovery port, and is configured to reduce a pressure in the recovery path to recover the liquid, supplied to a space between the projection optical system and the substrate, through the recovery port and the recovery path, and a heating unit which is disposed in the recovery path, and configured to heat the liquid recovered through the recovery port and the recovery path.

Further features of the present invention will become apparent from the following description of exemplary embodiments with reference to the attached drawings.

BRIEF DESCRIPTION OF THE DRAWINGS

FIG. 11 is a schematic view illustrating an example of a driving circuit for the heating unit of the exposure apparatus shown in FIG. 1.

DESCRIPTION OF THE EMBODIMENTS

Figure 1:
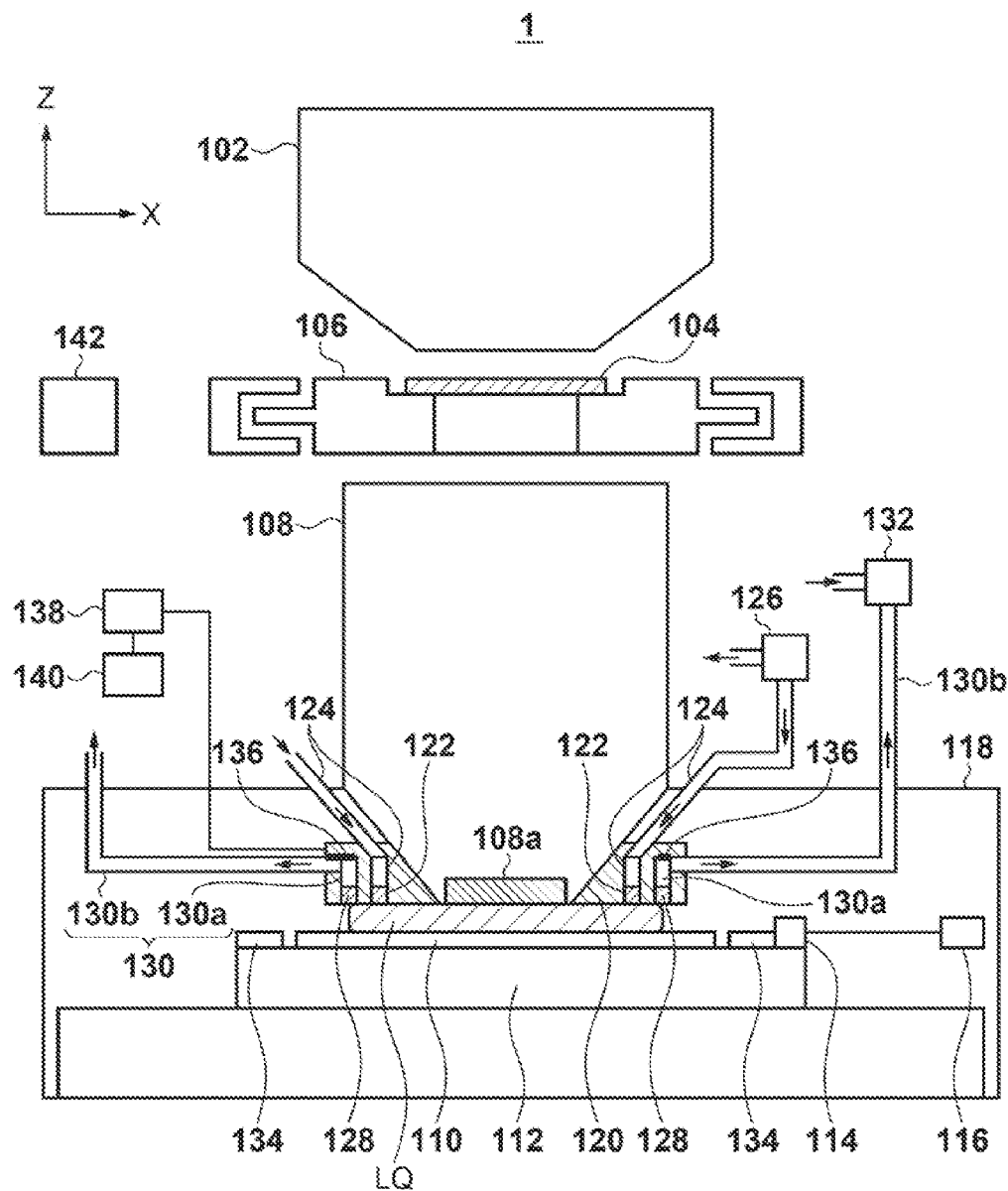
FIG. 1 is a schematic view showing the configuration of an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic view showing the configuration of an exposure apparatus 1 according to one aspect of the present invention. The exposure apparatus 1 serves as an immersion exposure apparatus which exposes a substrate by the step-and-scan scheme through a liquid supplied to the space between a projection optical system and a substrate. However, the exposure apparatus 1 can also adopt the step-and-repeat scheme or other exposure schemes.

The exposure apparatus 1 includes an illumination optical system 102, a reticle stage 106 which moves upon holding a reticle (original) 104, a projection optical system 108 which projects the pattern of the reticle 104 onto a substrate 110, and a substrate stage 112 which moves upon holding the substrate 110. The exposure apparatus 1 also includes an X-distance measuring mirror 114, X-distance measuring laser interferometer 116, partition 118, nozzle member 120, liquid supply unit 126, liquid recovery unit 132, and liquid holding plate 134. The exposure apparatus 1 moreover includes a heating unit 136, heating control unit 138, storage unit 140, and main control unit 142. The main control unit 142 includes, for example, a CPU and memory, and controls the overall exposure apparatus 1 (its operation). In addition, the main control unit 142 may include the function of the heating control unit 138 (to be described later).

The illumination optical system 102 illuminates the reticle 104 (its part) with slit light (light having a cross-sectional shape similar to that of light having passed through a slit) generated using light emitted by a light source (not shown) such as an ArF excimer laser or an $F_2$ laser. While the reticle 104 is illuminated by the illumination optical system 102, one of the reticle stage 106 which holds the reticle 104, and the substrate stage 112 which holds the substrate 110 moves (performs scan movement) in synchronism with the other. With this operation, the entire pattern formed on the reticle 104 is continuously imaged on the substrate 110 through the projection optical system 108 to expose a resist (photosensitive agent) applied onto the surface of the substrate 110.

Referring to FIG. 1, the X-distance measuring mirror 114 is placed on the substrate stage 112. The X-distance measuring laser interferometer 116 measures the position of the substrate stage 112 in the X-direction using the X-distance measuring mirror 114. A Y-distance measuring mirror (not shown) is also placed on the substrate stage 112, and a Y-distance measuring laser interferometer (not shown) measures the position of the substrate stage 112 in the Y-direction using the Y-distance measuring mirror. Similarly, a distance measuring mirror (not shown) is placed on the reticle stage 106, and a laser interferometer measures the position of the reticle stage 106 using the distance measuring mirror.

The positions of the reticle stage 106 and substrate stage 112 are measured in real time, and positioning and synchronous control of the reticle 104 (reticle stage 106) and substrate 110 (substrate stage 112) are performed under the control of the main control unit 142, based on the measurement results. The substrate stage 112 includes a driving unit for adjusting (changing) the position of the substrate 110 in the upward/downward direction (vertical direction) and rotation direction, and the tilt of the substrate 110. In exposing the substrate 110, the substrate stage 112 is controlled to always match an exposure region on the substrate 110 with the image plane (focal plane) of the projection optical system 108 with high accuracy. The surface (the position in the upward/downward direction and the tilt) of the substrate 110 is measured by an optical focus sensor (not shown), and the measurement results are provided to the main control unit 142.

The partition 118 defines (forms) an almost airtightly sealed space surrounding the vicinities of the substrate stage 112 and an optical element (final lens) 108a, closest to the substrate 110, of the projection optical system 108, that is, a space (to be referred to as a "substrate stage space" hereinafter) in which the substrate stage 112 is disposed. The substrate stage space is supplied with a gas controlled to a predetermined temperature and humidity from an air conditioner (not shown). With this operation, the substrate stage space is maintained at a predetermined temperature and humidity. As for the vicinity of the reticle stage 106, an almost airtightly sealed space surrounding the reticle stage 106 is similarly defined and maintained at a predetermined temperature and humidity.

The nozzle member 120 is disposed around the projection optical system 108, more specifically, to surround the optical element 108a. A supply port 122 for supplying a liquid LQ to the space between the projection optical system 108 (optical element 108a) and the substrate 110 is formed in the nozzle member 120 to surround the optical element 108a. The supply port 122 is connected to the liquid supply unit 126 via a supply path (supply conduit) 124.

A recovery port 128 for recovering the liquid LQ supplied to the space between the projection optical system 108 and the substrate 110 is also formed in the nozzle member 120 to surround the supply port 122. The recovery port 128 is connected to the liquid recovery unit 132 via a recovery path (recovery conduit) 130. The recovery path 130 includes a first path portion 130a located (formed) inside the nozzle member 120, and a second path portion 130b located outside the nozzle member 120. Also, the second path portion 130b includes a path portion located inside the substrate stage space, and a path portion located outside the substrate stage space. The liquid recovery unit 132 reduces the pressure in the recovery path 130 to recover the liquid LQ, supplied to the space between the projection optical system 108 and the substrate 110, through the recovery port 128 and recovery path 130. However, the liquid recovery unit 132 recovers the liquid LQ, supplied to the space between the projection optical system 108 and the substrate 110, while the liquid LQ is mixed with a gas (gas-liquid mixture state).

Although the supply port 122 and recovery port 128 may be formed by simple openings, they are desirably configured to supply or recover the liquid LQ in an almost uniform (in-plane) flow velocity distribution free from variations in supply and recovery flow rates of the liquid LQ, that depend on the position. It is therefore desired to arrange a plurality of small holes on the circumference of a circle to form the supply port 122 and recovery port 128. Alternatively, the supply port 122 and recovery port 128 may be formed by slits serving as minute gaps through which a gas is blown, or by a porous member such as a sintered material, foam material, fibrous material, or mesh made of a metal, resin, or inorganic substance used in, for example, a filter. Again, the supply port 122 and recovery port 128 may be formed by a plurality of members formed by staking the above-mentioned members.

The liquid supply unit 126 includes, for example, a tank which stores the liquid LQ, a gas compressor which feeds the liquid LQ, a flow controller which controls the supply flow rate of the liquid LQ, and a temperature controller which controls the supply temperature of the liquid LQ. The liquid recovery unit 132 includes, for example, a suction device which draws the liquid LQ by suction (that is, reduces the pressure in the recovery path 130), a tank which separates the gas from the liquid LQ recovered in a gas-liquid mixture state, and temporarily stores the liquid LQ, and a flow controller which controls the recovery flow rate of the liquid LQ.

As the liquid LQ, a liquid which absorbs less exposure light is used, more specifically, pure water, functional water, or a fluorinated solution (for example, fluorocarbon), for example, is used. Alternatively, as the liquid LQ, a liquid containing a dissolved gas sufficiently reduced in amount by a degasifier is used. By discharging, for example, 80% or more of a gas that can be dissolved in the liquid LQ, gas bubbles can be prevented from being generated and immediately absorbed in the liquid. Note that a degasifier may be built into the exposure apparatus 1 to supply the liquid LQ to the liquid supply unit 126 while always discharging the dissolved gas. An example of the degasifier is a vacuum degasifier which supplies a liquid to one side of a gas permeable membrane, while setting the other side in a vacuum to discharge a dissolved gas in a liquid through the gas permeable membrane into the vacuum.

The liquid holding plate 134 is a plate member which sets the surface of the substrate 110 held by the substrate stage 112 to be nearly flush with a region outside the substrate 110 (a region on the substrate stage 112), and serves to hold the liquid LQ at the end of the substrate 110. In exposing a shot near the end of the substrate 110, the liquid holding plate 134 can hold the liquid LQ in a region outside the substrate 110. The liquid holding plate 134 is formed by a material which is less prone to chemical contamination and is easily maintained clean, more specifically, stainless steel, fluororesin, or ceramics.

In this embodiment, the liquid supply unit 126 supplies the liquid LQ in a direction almost perpendicular to the surface of the substrate 110 or liquid holding plate 134 through the supply path 124 and supply port 122. This is done to efficiently supply the liquid LQ to the space between the projection optical system 108 and the substrate 110 as the substrate stage 112 moves in all directions. Also, as described above, the liquid LQ is recovered from the space between the projection optical system 108 and the substrate 110 through the recovery port 128 and recovery path 130. However, the supply port 122 and recovery port 128 need not be configured to supply and recover the liquid LQ in a direction perpendicular to the surface of the substrate 110, as shown in FIG. 1. In other words, the orientation of the supply port 122 for supplying the liquid LQ, and that of the recovery port 128 for recovering the liquid LQ are not limited to the perpendicular direction, and may be, for example, an oblique direction.

Also, although the surfaces (bottom surfaces) of the optical element 108a and nozzle member 120 (supply port 122 and recovery port 128), which are opposed to the substrate 110, are arranged within a plane at the same level in this embodiment, the present invention is not limited to these positional relationships. In other words, the surfaces of the optical element 108a and nozzle member 120, which are opposed to the substrate 110, may be arranged at different levels.

The heating unit 136 is disposed in the recovery path 130 to heat the liquid LQ (a fluid mixture of the liquid LQ and the gas) recovered through the recovery port 128 and recovery path 130. As described above, since the liquid LQ is recovered in a gas-liquid mixture state in which it is mixed with the gas, vaporization of the liquid LQ is promoted in the recovery path 130. Hence, in this embodiment, the amount of decrease in temperature of the liquid LQ, that is, the amount of decrease in temperature of the recovery path 130 is reduced by directly heating, using the heating unit 136, the liquid LQ recovered through the recovery port 128 and recovery path 130.

The heating control unit 138 controls (adjusts) heating of the liquid LQ by the heating unit 136 so that the amount of heat applied to the liquid LQ by the heating unit 136 becomes a predetermined amount of heat. For example, the heating control unit 138 controls heating of the liquid LQ by the heating unit 136 in accordance with a heating profile stored in the storage unit 140 such as a memory. The heating profile is time-series data (table) representing changes in amount of heat (optimum amount of heat), applied to the liquid LQ by the heating unit 136, over time. The storage unit 140 stores heating profiles for various conditions in advance, and the heating control unit 138 selects an optimum heating profile in accordance with the conditions involved (that is, a heating profile corresponding to the conditions under which the liquid LQ is heated). Note that the various conditions include, for example, the exposure conditions such as the type of resist applied onto the substrate 110, the pressure in the tank of the liquid recovery unit 132, and the moving track and moving velocity of the substrate stage 112. Since optimum heating profiles can be selected for all conditions by storing heating profiles for various conditions in the storage unit 140, the amount of decrease in temperature of the recovery path 130 can be effectively reduced.

Heating profiles (the amounts of heat applied to the liquid LQ by the heating unit 136) for various conditions may be obtained by experiments in advance. For example, the relationship between the amount of heat applied to the liquid LQ by the heating unit 136, and the temperature at a representative point (for example, the temperature of the projection optical system 108) is obtained for one type of resist applied onto the substrate 110 to determine the amount of heat applied to the liquid LQ so that the temperature at the representative point falls within an allowable temperature range. By obtaining relationships, as mentioned above, for all types of resists applied onto the substrate 110, heating profiles can be obtained for all these types of resists.

In this embodiment, the liquid LQ is heated in accordance with either heating profile stored in the storage unit 140. However, the temperature at a representative point may be detected in real time to control heating of the liquid LQ by the heating unit 136, based on the detection result, as will be described later.

Figure 2:
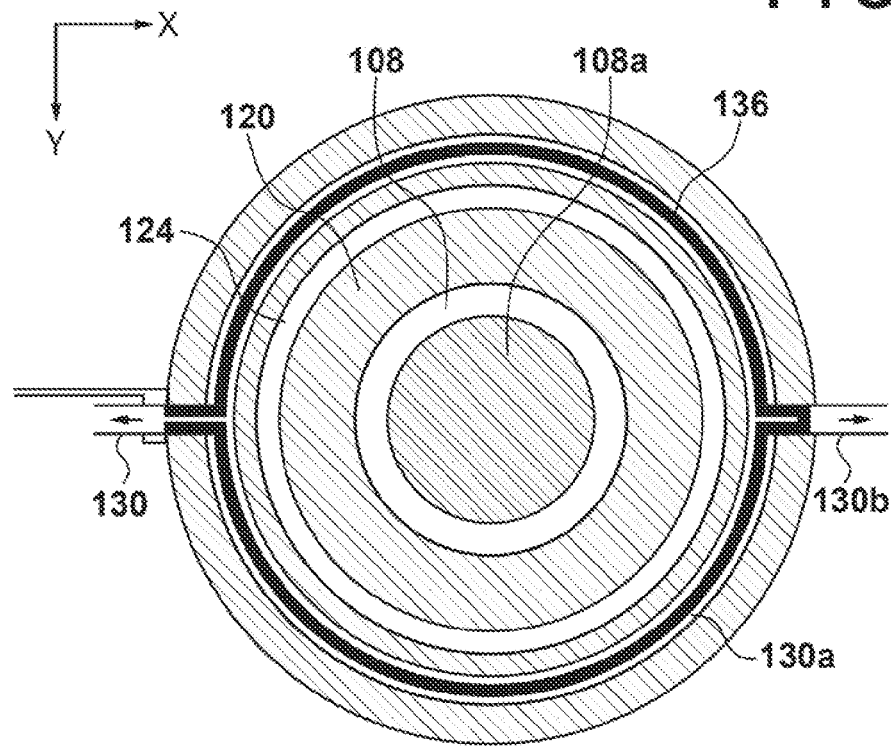
FIG. 2 is a sectional view showing a cross-section on a side that is above an optical element of a projection optical system and below a heating unit in the exposure apparatus shown in FIG. 1.

As shown in FIG. 2, the heating unit 136 is continuously disposed inside the recovery path 130 to heat the liquid LQ recovered through the recovery port 128 and recovery path 130, as described above. FIG. 2 is a sectional view illustrating an example of the arrangement of the heating unit 136, and shows a cross-section on a side that is above the optical element 108a of the projection optical system 108 and below the heating unit 136.

Referring to FIG. 2, the heating unit 136 is continuously disposed in the recovery path 130, more specifically, along the shape of the first path portion 130a located inside the nozzle member 120. With this operation, the amount of decrease in temperature of the entire circumference of the first path portion 130a located inside the nozzle member 120 can be reduced, thus effectively reducing the unevenness of the temperature distribution of the portion surrounding the recovery path 130. Although the heating unit 136 is disposed only inside the first path portion 130a in this embodiment, it need only be disposed inside at least one of the first path portion 130a and the second path portion 130b.

Figure 3:
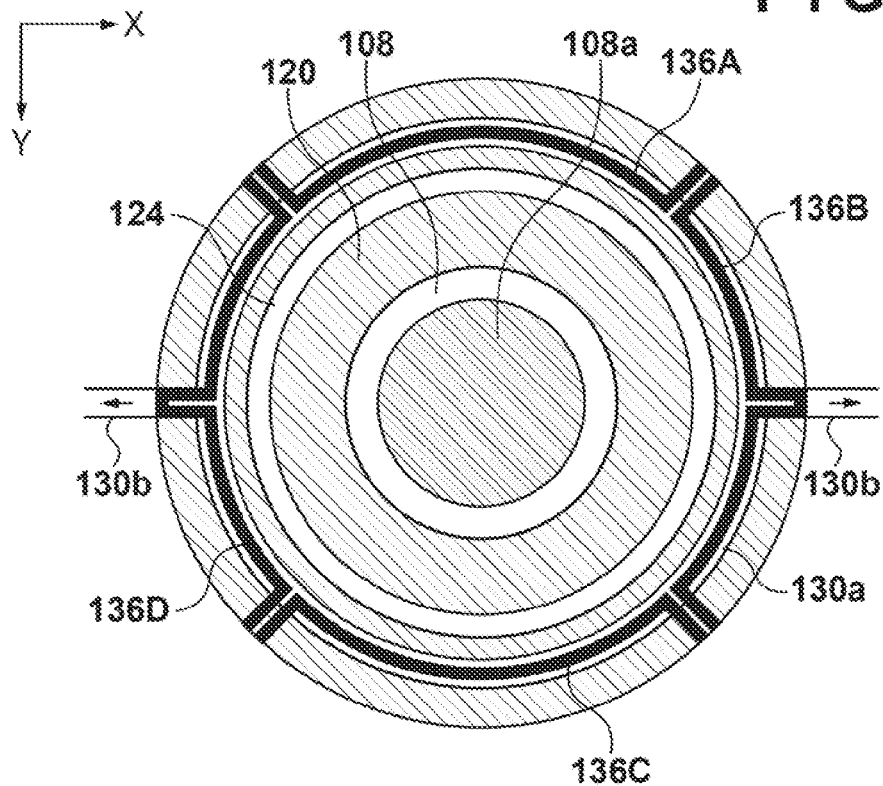
FIG. 3 is a sectional view showing another cross-section on the side that is above the optical element of the projection optical system and below the heating unit in the exposure apparatus shown in FIG. 1.

However, the heating unit 136 need not be continuously disposed on the entire circumference of the first path portion 130a. It is often the case that, for example, as the substrate stage 112 moves, variations in recovery flow rate of the liquid LQ recovered from the recovery port 128 occur depending on the position, so the rate of decrease in temperature of the liquid LQ recovered through the first path portion 130a varies across individual positions. In such a case, in the recovery path 130, that is, the first path portion 130a, the heating unit 136 need only be divided into some heating units and arranged to independently control the respective heating units (heating of the liquid LQ by these heating units), as shown in FIG. 3. FIG. 3 is a sectional view illustrating a modification of the arrangement of the heating unit 136, and shows a cross-section on a side that is above the optical element 108a of the projection optical system 108 and below the heating unit 136.

Referring to FIG. 3, in the first path portion 130a, a first heating unit 136A, second heating unit 136B, third heating unit 136C, and fourth heating unit 136D are arranged and independently controlled. In other words, the first heating unit 136A to fourth heating unit 136D are configured to heat the liquid LQ by different amounts of heat. The first heating unit 136A and third heating unit 136C are arranged in the ±Y-directions with respect to the optical element 108a. Also, the second heating unit 136B and fourth heating unit 136D are arranged in the ±X-directions with respect to the optical element 108a.

The recovery port 128 is formed to surround the entire circumference of the optical element 108a, as described above (see FIG. 3). Therefore, during exposure, the amount of vaporization of the liquid LQ in the recovery path 130 is different between the scanning direction (Y-direction) of the substrate stage 112 and a direction (X-direction) perpendicular to this scanning direction, so the rate of decrease in temperature is also different between these directions. This is because due to factors associated with the viscosity of the liquid LQ, the liquid LQ expands in the ±Y-directions, that is, the scanning direction in a relatively large amount during exposure. As the amount of the liquid LQ that expands in the ±Y-directions increases, the recovery flow rate of the liquid LQ rises in the portions of the first path portion 130a along the ±Y-directions, so the amount of a gas recovered together with the liquid LQ decreases in these portions. On the other hand, in the portions of the first path portion 130a along the ±X-directions, the recovery flow rate of the liquid LQ drops, so the amount of a gas recovered together with the liquid LQ increases. Hence, in the portions of the first path portion 130a along the ±X-directions, the amount of a gas is relatively small, so the rate of decrease in temperature is relatively low as vaporization of the liquid LQ is suppressed. However, in the portions of the first path portion 130a along the ±X-directions, the liquid LQ recovered near these portions mixes with a gas and promotes vaporization, so the rate of decrease in temperature is relatively high. As a result, during exposure, the rate of decrease in temperature of the liquid LQ in the recovery path 130 is different between the scanning direction of the substrate stage 112 and a direction perpendicular to this scanning direction (that is, variations in amount of decrease in temperature of the liquid LQ occur).

As shown in FIG. 3, when the first heating unit 136A, second heating unit 136B, third heating unit 136C, and fourth heating unit 136D are independently arranged, it is also possible to suppress variations in amount of decrease in temperature of the liquid LQ, that occur in the recovery path 130. More specifically, during exposure, the amounts of heat applied to the liquid LQ by the first heating unit 136A and third heating unit 136C arranged in the ±Y-directions are set small, while those of heat applied to the liquid LQ by the second heating unit 136B and fourth heating unit 136D arranged in the ±X-directions are set large. With this operation, even during exposure, the amount of decrease in temperature, that occurs in the first path portion 130a located inside the nozzle member 120, can be effectively reduced, thus reducing the unevenness of the temperature distribution of the portion surrounding the recovery path 130.

Also, independent control of the first heating unit 136A to fourth heating unit 136D (heating of the liquid by them) is not limited to the exposure time, and may be performed in, for example, moving the substrate stage 112 to a position at which the substrate 110 is replaced. In such a case, the amount of heat applied to the liquid LQ by a heating unit arranged in the moving direction of the substrate stage 112 may be set small, while that of heat applied to the liquid LQ by a heating unit arranged on a side opposite to the moving direction of the substrate stage 112 is set large.

Although four heating units (first heating unit 136A to fourth heating unit 136D) are arranged in the recovery path 130 in FIG. 3, the number of heating units arranged in the recovery path 130 is not limited to four. Five or more heating units, for example, may be arranged to more efficiently reduce the amount of decrease in temperature of the liquid LQ, that occurs in the recovery path 130.

Also, although the recovery path 130 (first path portion 130a) is formed as one continuous path inside the nozzle member 120 in FIG. 3, it may be formed as a plurality of separate paths. In such a case, it is desired to arrange heating units in a plurality of paths, respectively, that form the first path portion 130a to control the amount of heat applied to the liquid LQ by the heating unit for each of the plurality of paths. With this arrangement, even if the first path portion 130a is formed by a plurality of paths, it is possible to effectively reduce the amount of decrease in temperature, that occurs in the first path portion 130a. Also, in each of a plurality of paths that form the first path portion 130a, the heating unit may be divided into some heating units and arranged to independently control the respective heating units for each of the plurality of paths.

Figure 4:
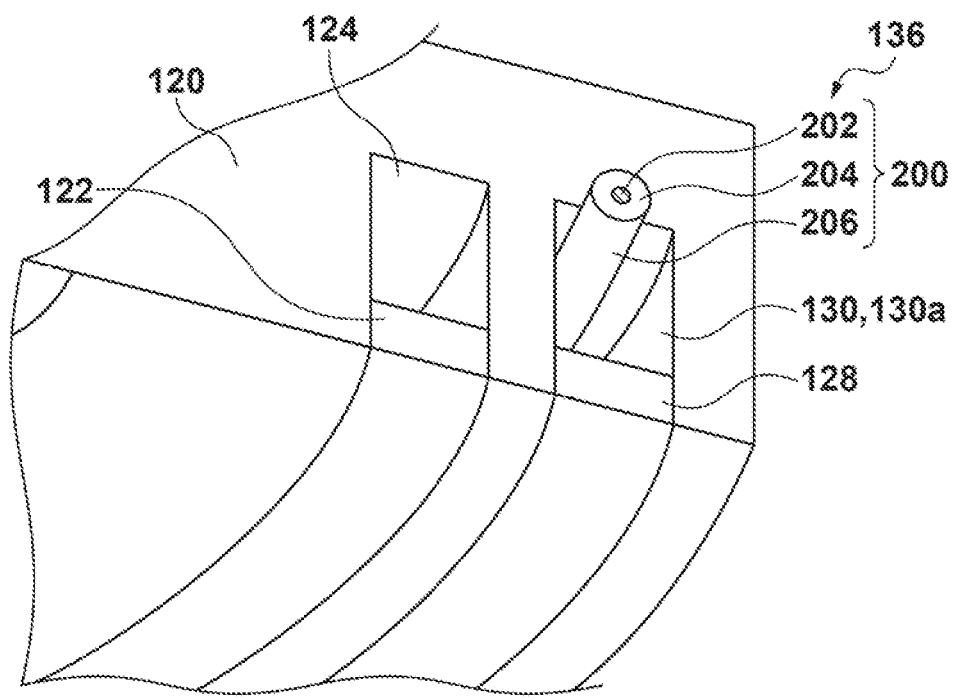
FIG. 4 is a view for explaining the practical arrangement of the heating unit in the exposure apparatus shown in FIG. 1.

The practical arrangement of the heating unit 136 will be described with reference to FIG. 4. FIG. 4 is a schematic view showing the vicinities of the supply path 124 and recovery path 130 (first path portion 130a) in the nozzle member 120. Referring to FIG. 4, the heating unit 136 is formed by, for example, a sheathed heater 200. The sheathed heater 200 can be freely shaped in accordance with the shape of the recovery path 130, so it can be easily disposed inside the first path portion 130a by shaping it in accordance with the shape of the first path portion 130a.

The sheathed heater 200 includes a nichrome wire 202 serving as an exothermic wire, an insulating powder 204 such as magnesium oxide (MgO), and a sheathed pipe 206 such as SUS316L, as shown in FIG. 4. The sheathed heater 200 is not limited to a single-conductor heater as shown in FIG. 4. The sheathed heater 200 may be, for example, a twin-conductor heater, and need only be selected in accordance with conditions including the required amount of generated heat and the space constraint.

As shown in FIG. 4, by disposing the sheathed heater 200 on the upper surface of the recovery path 130 (first path portion 130a), the sheathed heater 200 can directly heat the liquid LQ without hampering the flow of the liquid LQ recovered through the recovery port 128. With this operation, the amount of decrease in temperature of the liquid LQ can be efficiently reduced, without increasing the amount of heat applied to the liquid LQ by the sheathed heater 200, that is, even if the amount of heat applied to the liquid LQ by the sheathed heater 200 is set small. Also, an increase in temperature of the portion surrounding the sheathed heater 200 (the portion surrounding the recovery path 130) can be suppressed by setting the amount of heat, applied to the liquid LQ by the sheathed heater 200, small. This makes it possible to reduce both the amount of decrease in temperature of the liquid LQ in the recovery path 130, and the unevenness of the temperature distribution of the portion surrounding the recovery path 130.

However, even when the amount of heat applied to the liquid LQ by the sheathed heater 200 is set small, the temperature of the portion surrounding the recovery path 130, for example, the temperature of the nozzle member 120 often increases albeit slightly. In such a case, it is desired to dispose a heat insulating material between the sheathed heater 200 and the nozzle member 120 (recovery path 130) to reduce the amount of increase in temperature of the nozzle member 120. Alternatively, the nozzle member 120 may be formed by a material with a low thermal conductivity, instead of disposing a heat insulating material between the sheathed heater 200 and the nozzle member 120.

Also, the position at which the sheathed heater 200 is disposed is not limited to the upper surface of the recovery path 130. It is often impossible to set the thickness of the nozzle member 120 (in the Z-direction) small due, for example, to the space constraint. In such a case, the sheathed heater 200 may be disposed on the side surface of the recovery path 130. When the sheathed heater 200 is disposed on the side surface of the recovery path 130 as well, it is possible to obtain the same effect as that obtained when the sheathed heater 200 is disposed on the upper surface of the recovery path 130. Alternatively, sheathed heaters 200 may be disposed on both the upper and side surfaces of the recovery path 130.

Moreover, the heating unit 136 is not limited to the sheathed heater 200, and need only be able to heat the liquid LQ recovered through the recovery port 128 and recovery path 130. The heating unit 136 may be, for example, a sheet heater that can be machined into an arbitrary shape, like a sheathed heater.

Again, the heating unit 136 is not limited to a heater, and may be, for example, a Peltier device. The Peltier device is a device whose heat absorption and dissipation can be controlled in accordance with the direction in which a current flows. Therefore, the temperature of the liquid LQ in the recovery path 130 can be efficiently controlled by, for example, disposing a temperature sensor near the recovery path 130, and controlling the current value and the direction, in which a current is supplied to the Peltier device, based on the detection result obtained by the temperature sensor.

<Second Embodiment>

Figure 5:
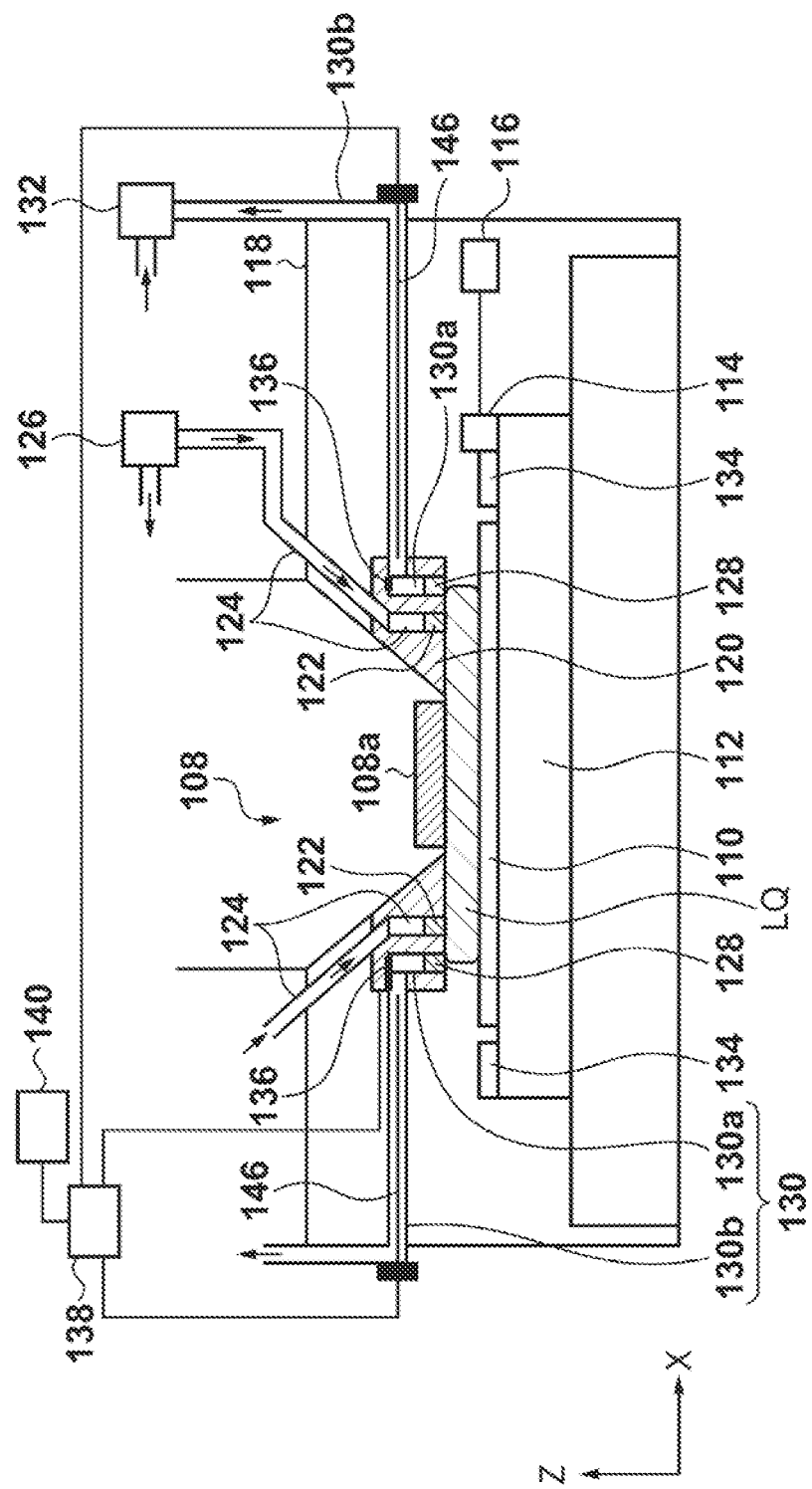
FIG. 5 is a schematic view showing the configuration in the vicinity of a substrate stage in the exposure apparatus shown in FIG. 1.

FIG. 5 is a schematic view showing the configuration in the vicinity of a substrate stage 112 in an exposure apparatus 1. In this embodiment, in a recovery path 130, heating units 146 are disposed not only in a first path portion 130*a* (a heating unit 136 disposed in it) located inside a nozzle member 120, but also in a second path portion 130*b* located inside a substrate stage space. The heating unit 146 directly heats a liquid LQ recovered through a recovery port 128 and the recovery path 130, like the heating unit 136.

As described above, since the liquid LQ is recovered in a gas-liquid mixture state in which it is mixed with the gas, vaporization of the liquid LQ is promoted in the recovery path 130. Therefore, a decrease in temperature also occurs in the second path portion 130*b* located in the substrate stage space. When this occurs, a decrease in temperature also occurs around the second path portion 130*b*, so a local decrease in temperature occurs in the substrate stage space. The local decrease in temperature in the substrate stage space leads to an error (distance measurement error) generated upon measurement of the position of the substrate stage 112 by, for example, a laser interferometer 116.

Hence, in this embodiment, the heating unit 146 is disposed inside the second path portion 130*b* located inside the substrate stage space. By directly heating, using the heating unit 146, the liquid LQ recovered in a gas-liquid mixture state in the second path portion 130*b*, the amount of decrease in temperature of the second path portion 130*b* is efficiently reduced.

A heating control unit 138 independently controls the heating units 136 and 146 (heating of the liquid LQ by them). This is done to control the heating units 136 and 146 in accordance with the corresponding amounts of heat as the required temperature accuracy is different between the nozzle member 120 and the substrate stage space. The heating control unit 138 controls heating of the liquid LQ by the heating units 136 and 146 in accordance with heating profiles stored in a storage unit 140, as described above. However, if the amounts of decrease in temperature of both the nozzle member 120 and substrate stage space can be kept within tolerances, the heating units 136 and 146 need not be independently controlled. The heating control unit 138 may control heating of the liquid LQ by the heating units 136 and 146 so that the amount of heat applied to the liquid LQ by the heating unit 136 becomes equal to that of heat applied to the liquid LQ by the heating unit 146 (that is, using the same heating profile).

The second path portion 130*b* located in the substrate stage space is supported by a support member (not shown) so that the heating unit 146 can be disposed inside the second path portion 130*b*. The second path portion 130*b* in which the heating unit 146 is disposed is supported by a support member so that the heating unit 146 has the same shape as that of the second path portion 130*b*.

Figure 6:
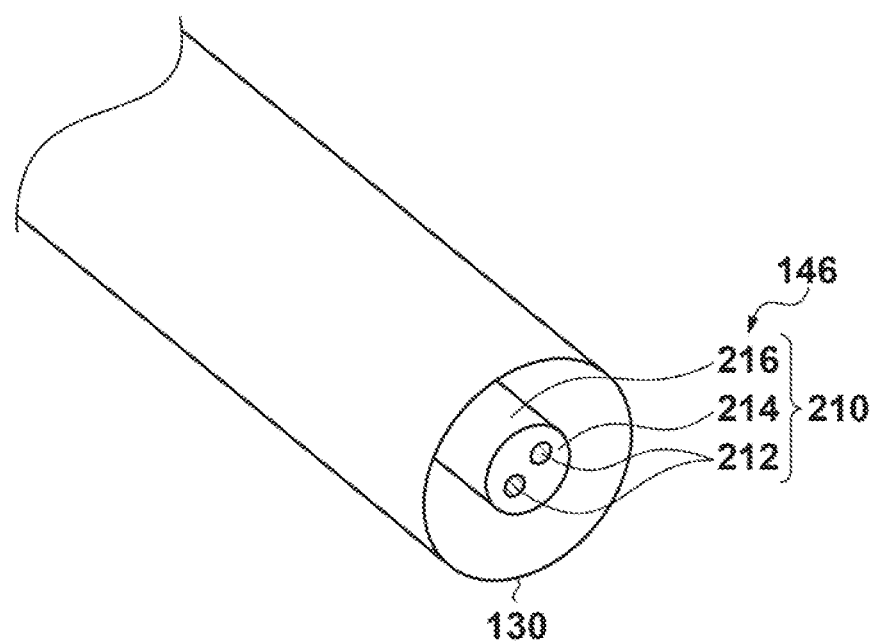
FIG. 6 is a view for explaining the practical arrangement of the heating unit in the exposure apparatus shown in FIG. 1.

The practical arrangement of the heating unit 146 will be described with reference to FIG. 6. FIG. 6 is a schematic view showing a cross-section (a cross-section in a direction perpendicular to the flow of the liquid LQ) of the recovery path 130 (second path portion 130*b*) located in the substrate stage space. Referring to FIG. 6, the heating unit 146 is formed by a sheathed heater 210.

The sheathed heater 210 includes a nichrome wire 212 serving as an exothermic wire, an insulating powder 214 such as magnesium oxide (MgO), and a sheathed pipe 216 such as SUS316L, as shown in FIG. 6. The sheathed heater 210 is a screwed twin-conductor heater that can be attached from one side of the recovery path 130 (second path portion 130*b*).

A heat insulating material may be disposed outside the second path portion 130*b* located in the substrate stage space. This makes it possible to reduce the adverse effect that a decrease in temperature of the liquid LQ in the second path portion 130*b* has on the substrate stage 112, thus more effectively reducing the unevenness of the temperature distribution of the portion surrounding the second path portion 130*b*.

In this embodiment, one sheathed heater 210 is disposed in each of two second path portions 130*b* located in the substrate stage space. However, depending on the arrangement of the exposure apparatus, only one sheathed heater 210 is often insufficient to heat the entire interior of one second path portion 130*b* located in the substrate stage space. In such a case, a plurality of sheathed heaters 210 need only be arranged to heat the entire interior of the second path portion 130b. This makes it possible to set a given level of freedom for the arrangement of the recovery path 130 (second path portion 130b) to improve the level of freedom of apparatus design.

<Third Embodiment>

Figure 7:
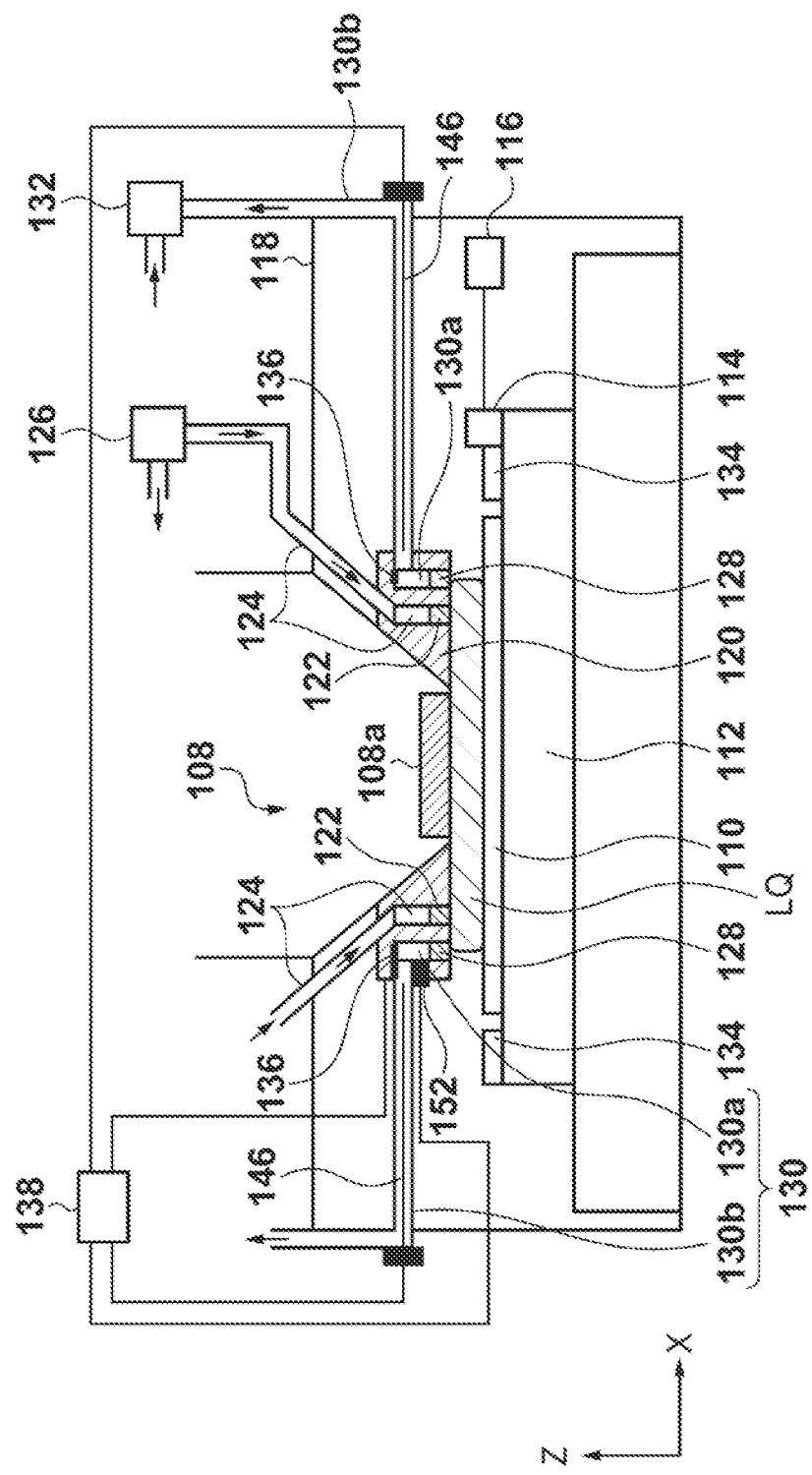
FIG. 7 is a schematic view showing the configuration in the vicinity of the substrate stage in the exposure apparatus shown in FIG. 1.

FIG. 7 is a schematic view showing the configuration in the vicinity of a substrate stage 112 in an exposure apparatus 1. In this embodiment, a detection unit 152 is disposed on a nozzle member 120, more specifically, near a recovery port 128. The detection unit 152 includes a temperature sensor, and detects the temperature at a representative point, for example, the temperature of the nozzle member 120 in real time.

A heating control unit 138 controls heating of a liquid LQ by heating units 136 and 146, based on the detection result obtained by the detection unit 152. The heating control unit 138 controls heating of the liquid LQ by the heating units 136 and 146 so that, for example, the difference between a temperature T detected by the detection unit 152, and a target temperature Ts (the target temperature of the nozzle member 120) falls within a tolerance.

With this operation, in this embodiment, the heating control unit 138 feeds back the temperature T detected by the detection unit 152 to control heating of the liquid LQ by the heating units 136 and 146 so that the difference (deviation) between the temperature T and the target temperature Ts becomes zero. If the amount of decrease in temperature in the vicinity of the recovery port 128 temporarily increases due, for example, to degradation in flow rate balance between the gas and the liquid LQ recovered through the recovery port 128 and a recovery path 130, the heating control unit 138 increases the amount of heat applied to the liquid LQ by the heating unit 136. As the amount of decrease in temperature in the vicinity of the recovery port 128 comes close to the original state upon a return of the flow rate balance between the gas and the liquid LQ, the heating control unit 138 decreases the amount of heat applied to the liquid LQ by the heating unit 136.

In this embodiment, even if the flow rate balance between the gas and the liquid LQ recovered through the recovery port 128 and recovery path 130 degrades, it is possible to effectively reduce the amount of decrease in temperature, that occurs in the recovery path 130, thus reducing the unevenness of the temperature distribution of the portion surrounding the recovery path 130.

Also, although the detection unit 152 is disposed near the recovery port 128 in this embodiment, the present invention is not limited to this. The detection unit 152 need only be disposed to detect at least one of, for example, the temperature of the liquid LQ recovered by a liquid recovery unit 132, the temperature of the inner portion of a projection optical system 108 on the substrate side, and the temperature of the substrate stage space. More specifically, the detection unit 152 may be disposed in, for example, the projection optical system 108, an optical element 108a, the nozzle member 120, the recovery path 130, the substrate stage 112, or the substrate stage space.

Moreover, the detection unit 152 may be disposed in accordance with the position of a portion that may be adversely affected by a decrease in temperature of the liquid LQ in the recovery path 130. To prevent a decrease in temperature of the liquid LQ in the recovery path 130 from adversely affecting, for example, the projection optical system 108, the detection unit 152 need only be disposed in the projection optical system 108 to detect the temperature of the projection optical system 108 (its inner portion on the substrate side). Also, to prevent a decrease in temperature of the liquid LQ in the recovery path 130 from adversely affecting, for example, the substrate stage space, the detection unit 152 need only be disposed in the substrate stage space to detect the temperature of the substrate stage space. Further, a plurality of detection units 152 may be disposed at a plurality of positions (for example, in the projection optical system 108 and substrate stage space) to control heating of the liquid LQ by the heating units 136 and 146, based on the detection results obtained by the plurality of detection units 152.

<Fourth Embodiment>

Figure 8:
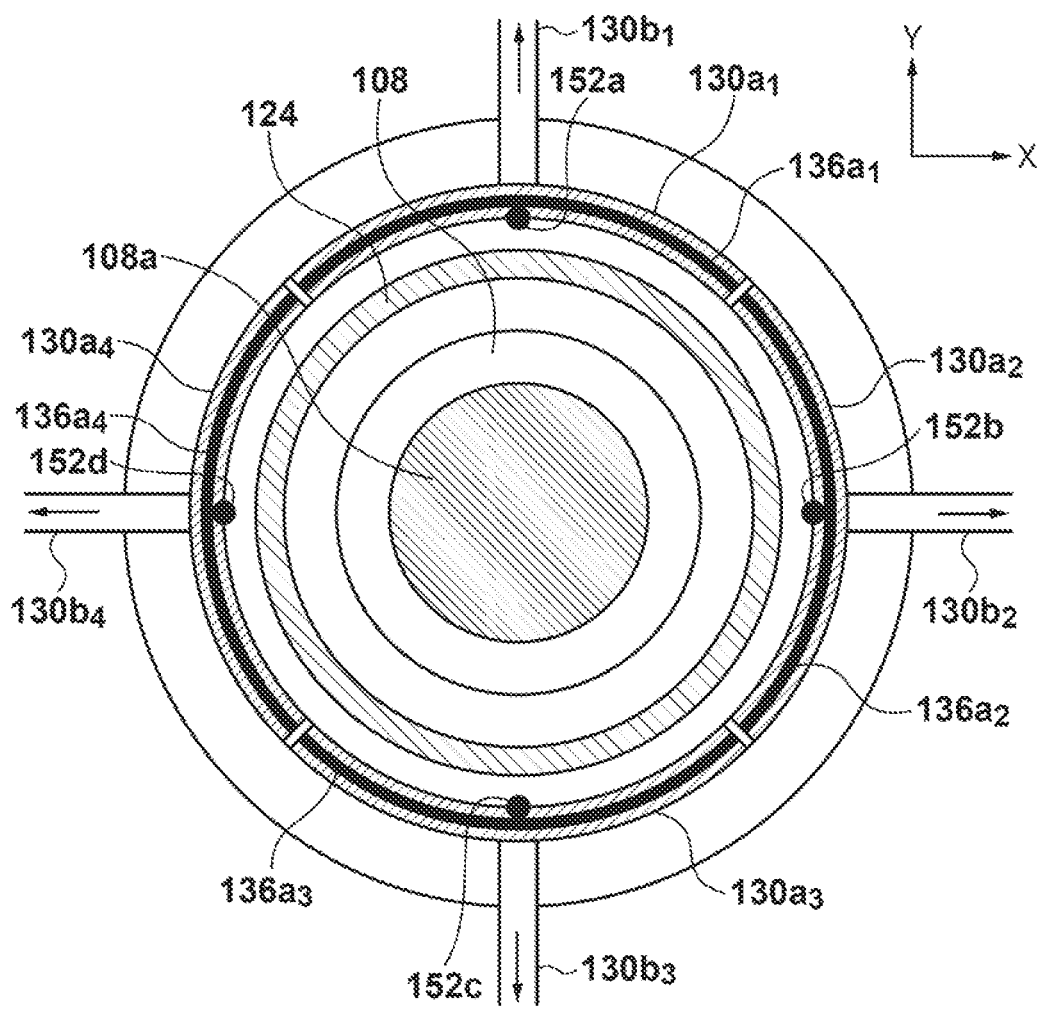
FIG. 8 is a sectional view showing still another cross-section on the side that is above the optical element of the projection optical system and below the heating unit in the exposure apparatus shown in FIG. 1.

FIG. 8 is a sectional view illustrating an example of the arrangement of a heating unit 136, and shows a cross-section on a side that is above an optical element 108a of a projection optical system 108 and below the heating unit 136. In this embodiment, a liquid LQ supplied to the space between the projection optical system 108 and a substrate 110 is recovered through recovery paths 130 arranged in four portions in the X- and Y-directions upon defining the center of the optical element 108a as an origin. The recovery path 130 includes four divided first path portions $130a_1$, $130a_2$, $130a_3$, and $130a_4$, and second path portions $130b_1$, $130b_2$, $130b_3$, and $130b_4$ corresponding to the first path portions $130a_1$ to $130a_4$, respectively. As in the first path portions $130a_1$ to $130a_4$, a recovery port 128 is also divided into four parts upon defining the center of the optical element 108a as an origin.

The heating unit 136 is disposed along the shape of the first path portion 130a located inside the nozzle member 120. More specifically, the heating unit 136 is disposed upon being divided into four parts: a first heating unit $136a_1$, second heating unit $136a_2$, third heating unit $136a_3$, and fourth heating unit $136a_4$. Each of the first heating unit $136a_1$ to fourth heating unit $136a_4$ is continuously disposed along the shape of the corresponding one of the first path portions $130a_1$ to $130a_4$. The first heating unit $136a_1$ to fourth heating unit $136a_4$ are independently controlled, and can heat the liquid LQ in the first path portions $130a_1$ to $130a_4$, respectively. Also, each of the first heating unit $136a_1$ to fourth heating unit $136a_4$ includes a plurality of heating regions that can heat the liquid LQ by different amounts of heat.

Although the heating unit 136 is divided into four parts: the first heating unit $136a_1$ to fourth heating unit $136a_4$ in correspondence with the first path portions $130a_1$ to $130a_4$ in this embodiment, the present invention is not limited to this. The heating unit 136 may be divided into smaller parts (that is, five or more parts), independently of the first path portions $130a_1$ to $130a_4$.

Detection units 152a, 152b, 152c, and 152d are arranged near the recovery port 128, more specifically, inside the first path portions $130a_1$ to $130a_4$, respectively. Each of the detection units 152a to 152d includes a temperature sensor, and detects the temperature (of the liquid LQ) in the corresponding one of the first path portions $130a_1$ to $130a_4$. In this embodiment, one detection unit is disposed in each of the first path portions $130a_1$ to $130a_4$. However, the number of detection units arranged in each of the first path portions $130a_1$ to $130a_4$ may be increased to accurately detect temperature distributions generated by the first path portions $130a_1$ to $130a_4$.

Figure 9A:
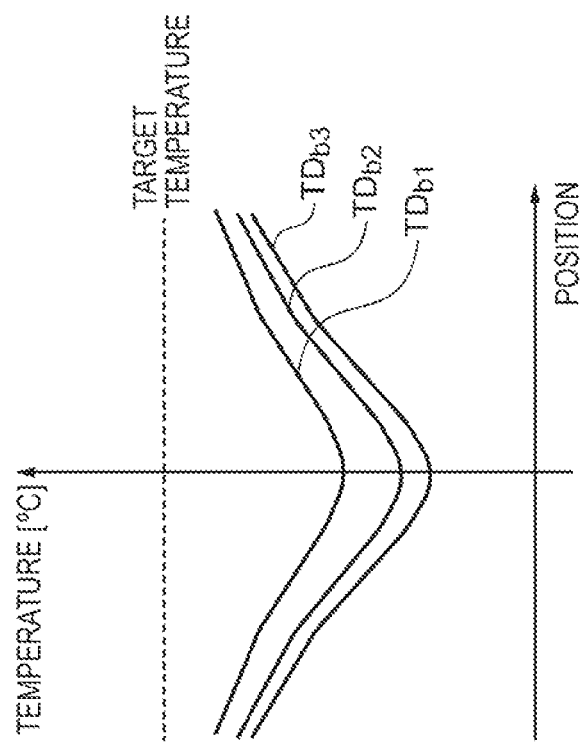
FIGS. 9A and 9B are graphs illustrating an example of temperature distributions generated by a first recovery path while the substrate stage of the exposure apparatus shown in FIG. 1 is in still and moving states, respectively.
Figure 9B:
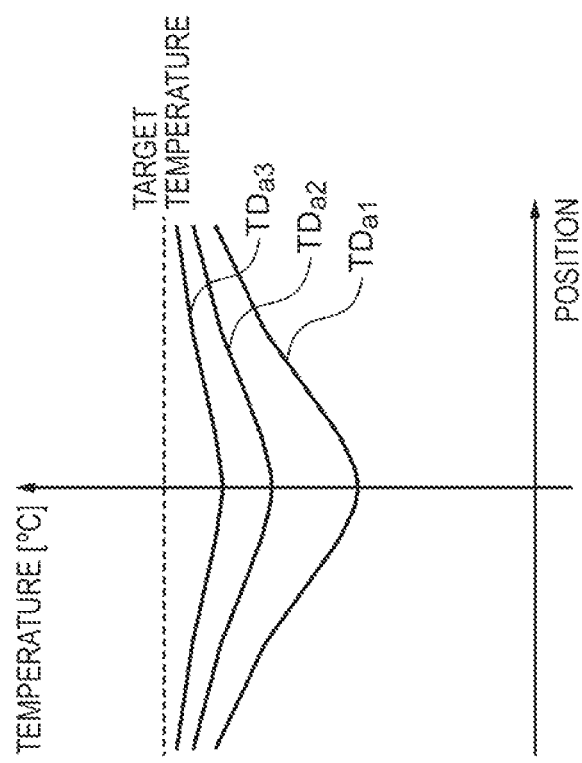

FIGS. 9A and 9B are graphs illustrating an example of temperature distributions generated by the first path portions $130a_1$ and $130a_2$ while a substrate stage 112 is in a still state (during non-exposure) and a moving state (during exposure), respectively. FIG. 9A shows the position of the first path portion $130a_1$ upon defining the second path portion $130b_1$ as an origin on the abscissa, and the temperature [° C.] at each position of the first path portion $130a_1$ on the ordinate. Similarly, FIG. 9B shows the position of the first path portion $130a_2$ upon defining the second path portion $130b_2$ as an origin on the abscissa, and the temperature [° C.] at each position of the first path portion $130a_2$ on the ordinate. Reference symbols $TD_{a1}$, $TD_{a2}$, and $TD_{a3}$ denote the temperature distributions generated by the first path portion $130a_1$; and $TD_{b1}$, $TD_{b2}$, and $TD_{b3}$, the temperature distributions generated by the first path portion $130a_2$. The temperature distributions $TD_{a1}$ and $TD_{b1}$ are obtained while the substrate stage 112 stands still. The temperature distributions $TD_{a2}$ and $TD_{b2}$ are obtained while the substrate stage 112 moves at a first velocity (low velocity). The temperature distributions $TD_{a3}$ and $TD_{b3}$ are obtained while the substrate stage 112 moves at a second velocity (high velocity) higher than the first velocity. Note that the temperature distributions generated by the first path portions $130a_3$ and $130a_4$ are identical to those generated by the first path portions $130a_1$ and $130a_2$, and a detailed description thereof will not be given herein.

Referring to FIGS. 9A and 9B, when the liquid LQ has no nonuniformity with respect to the optical axis (center) of the projection optical system 108 (optical element 108a) while the substrate stage 112 stands still, the temperature distributions $TD_{a1}$ and $TD_{b1}$ have almost equivalent shapes. Note that when the liquid LQ has no nonuniformity, the first path portions $130a_1$ to $130a_4$ have no variations in mixture ratio between the liquid LQ and the gas. Also, the liquid LQ recovered to the recovery path 130 (a fluid mixture of the liquid LQ and the gas) flows from the first path portions $130a_1$ and $130a_2$ to the second path portions $130b_1$ and $130b_2$ while it vaporizes. Therefore, the amount of decrease in temperature increases in a direction coming closer to the positions of the second path portions $130b_1$ and $130b_2$.

While the substrate stage 112 moves at the first velocity, the rate of decrease in average temperature in the first path portion $130a_1$ drops, so the gradient of the temperature distribution (distribution curve) becomes gentle, as indicated by the temperature distribution $TD_{a2}$. This occurs because as the substrate stage 112 moves in the Y-direction, the liquid LQ expands in the Y-direction, the recovery flow rate of the liquid LQ in the first path portion $130a_1$ rises, and the amount of a gas recovered together with the liquid LQ decreases (that is, the amount of heat of vaporization decreases). On the other hand, as the substrate stage 112 moves in the Y-direction, the liquid LQ shrinks in the X-direction, the recovery flow rate of the liquid LQ in the first path portion $130a_2$ drops, and the amount of a gas recovered together with the liquid LQ increases. Therefore, the rate of decrease in average temperature in the first path portion $130a_2$ rises, so the gradient of the temperature distribution (distribution curve) becomes steep, as indicated by the temperature distribution $TD_{b2}$.

While the substrate stage 112 moves at the second velocity, the liquid LQ further expands in the Y-direction, and further shrinks in the X-direction. Therefore, compared to the temperature distribution $TD_{a2}$, the rate of decrease in average temperature in the first path portion $130a_1$ further drops, so the gradient of the temperature distribution becomes gentler, as indicated by the temperature distribution $TD_{a3}$. Also, compared to the temperature distribution $TD_{b2}$, the rate of decrease in average temperature in the first path portion $130a_2$ rises, so the gradient of the temperature distribution becomes steeper, as indicated by the temperature distribution $TD_{b3}$.

Figure 10A:
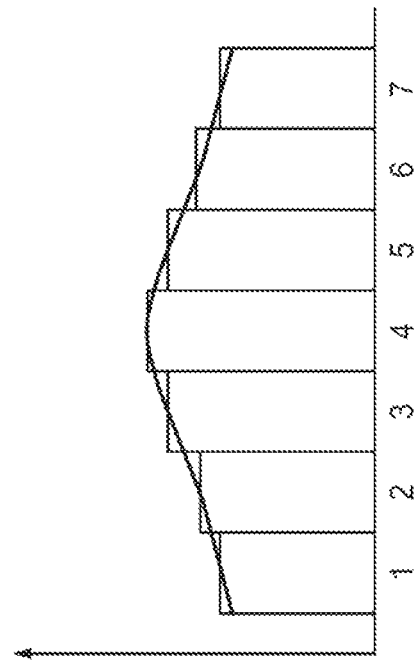
FIGS. 10A and 10B are graphs showing the amounts of heat applied to the liquid by first and second heating units, respectively, of the exposure apparatus shown in FIG. 1.
Figure 10B:
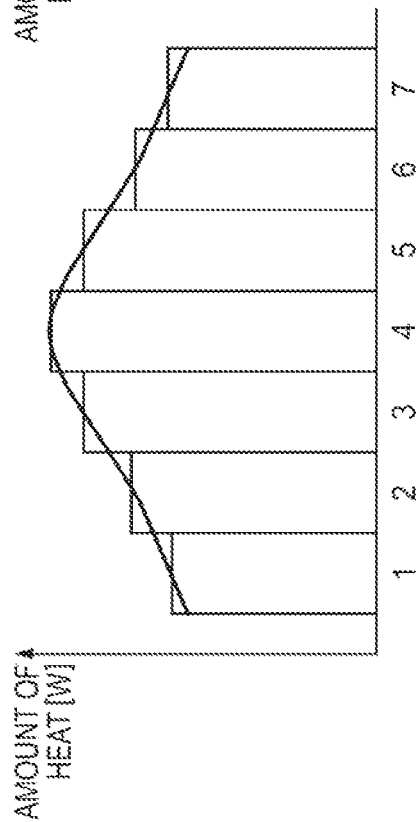

FIGS. 10A and 10B are graphs showing the amounts of heat (heat amount distributions) applied to the liquid LQ by the first heating unit $136a_1$ located in the first path portion $130a_1$. In this case, the first heating unit $136a_1$ includes seven heating regions, and the fourth heating region is located at a position having a maximum amount of heat of vaporization, that is, the position of the second path portion $130b_1$. Also, FIGS. 10A and 10B show the heating region (its number) included in the first heating unit $136a_1$ on the abscissa, and the amount of heat applied to the liquid LQ by each heating region on the ordinate.

An arbitrary heat amount distribution can be formed in the first path portion $130a_1$ by changing the amounts of heat applied to the liquid LQ by the seven heating regions included in the first heating unit $136a_1$, as shown in FIGS. 10A and 10B. The heat amount distribution shown in FIG. 10A represents the amount of heat applied to the liquid LQ by each heating region in the first heating unit $136a_1$ so that the temperature distribution $TD_{a1}$ generated by the first path portion $130a_1$ while the substrate stage 112 stands still becomes a predetermined temperature distribution. Also, the heat amount distribution shown in FIG. 10B represents the amount of heat applied to the liquid LQ by each heating region in the first heating unit $136a_1$ so that the temperature distribution $TD_{a2}$ generated by the first path portion $130a_1$ while the substrate stage 112 moves becomes a predetermined temperature distribution. The predetermined temperature distribution means herein, for example, a distribution having a temperature at each position of the first path portion $130a_1$, which is equal to the target temperature shown in FIG. 9A.

In this manner, the amounts of heat applied to the liquid LQ by the respective heating regions included in the first heating unit $136a_1$ to fourth heating unit $136a_4$ are determined so that the temperature distributions generated by the first path portions $130a_1$ to $130a_4$ become predetermined temperature distributions. Each of the first heating unit $136a_1$ to fourth heating unit $136a_4$ heats the liquid LQ in each heating region in accordance with the determined amount of heat. This makes it possible to effectively reduce the amounts of decrease in temperature, especially, temperature variations generated by the first path portion $130a_1$ to first path portion $130a_4$, thus reducing the unevenness of the temperature distribution of the portion surrounding the recovery path 130. Also, a heating control unit 138 determines the amounts of heat applied to the liquid LQ by a plurality of heating regions included in the first heating unit $136a_1$ to fourth heating unit $136a_4$. Hence, the heating control unit 138 also functions as a determination unit which determines the amounts of heat applied to the liquid LQ by a plurality of heating regions included in the first heating unit $136a_1$ to fourth heating unit $136a_4$.

In this embodiment, the amounts of heat applied to the liquid LQ by a plurality of heating regions included in the first heating unit $136a_1$ to fourth heating unit $136a_4$ are determined based on the velocity of the substrate stage 112. However, the shape of the liquid LQ supplied to the space between the projection optical system 108 and the substrate 110 also changes depending on the acceleration, amount of movement, and moving direction of the substrate stage 112. In other words, the temperature distributions generated by the first path portions $130a_1$ to $130a_4$ also depend on the acceleration, amount of movement, and moving direction of the substrate stage 112. Therefore, the heating control unit 138 can determine the amounts of heat applied to the liquid LQ by a plurality of heating regions included in the first heating unit $136a_1$ to fourth heating unit $136a_4$, based on at least one of the acceleration, velocity, amount of movement, and moving direction of the substrate stage 112. The temperature distributions generated by the first path portions $130a_1$ to $130a_4$ also depend on the type of water-repellent coating material applied onto the surface of the substrate 110 or the substrate stage 112. Therefore, the heating control unit 138 desirably determines the amounts of heat applied to the liquid LQ by a plurality of heating regions, based on at least one of the type of water-repellent coating material applied onto the surface of the substrate 110, and that of water-repellent coating material applied onto the surface of the substrate stage 112.

Also, the amounts of heat applied to the liquid LQ by a plurality of heating regions included in the first heating unit $136a_1$ to fourth heating unit $136a_4$ may be determined in advance by, for example, simulation, and heat amount information indicating the determined amounts of heat may be stored in a storage unit 140. In this case, the first heating unit $136a_1$ to fourth heating unit $136a_4$ heat the liquid LQ in the respective heating regions in accordance with the heat amount information stored in the storage unit 140. The temperature distributions generated by the first path portions $130a_1$ to $130a_4$ depend on the acceleration, velocity, amount of movement, and moving direction of the substrate stage 112, as described above. It is therefore desired to store heat amount information in the storage unit 140 for each moving profile of the substrate stage 112.

In this embodiment, the amounts of heat applied to the liquid LQ by a plurality of heating regions included in the heating unit 136 are controlled to effectively reduce the amount of decrease in temperature, especially, temperature variations generated by the recovery path 130. This means that the number of wiring lines connected to the heating unit 136 including a plurality of heating regions, and the number of drivers (for example, voltage and current drivers) for supplying currents to the heating unit 136 may increase, thus posing a problem associated with mounting.

Hence, in this embodiment, a driving circuit 500 for driving the heating unit 136 is used, as shown in FIG. 11. FIG. 11 is a schematic view illustrating an example of the driving circuit 500 of the heating unit 136. In this case, the heating unit 136 includes seven heating regions: a first heating region $HR_1$, second heating region $HR_2$, third heating region $HR_3$, fourth heating region $HR_4$, fifth heating region $HR_5$, sixth heating region $HR_6$, and seventh heating region $HR_7$.

The heating control unit 138 outputs manipulated variables corresponding to the amounts of heat applied to the liquid LQ by the first heating region $HR^1$ to seventh heating region $HR_7$ via a driver DR. The output (manipulated variable) from the driver DR is input to a predetermined heating region via a selection switch SW for selecting either of the first heating region $HR_1$ to seventh heating region $HR_7$. When, for example, the first heating region $HR_1$ is driven, switches SW1 and SW2 of the selection switch SW are turned on, while the other switches SW3 to SW8 are turned off. Also, when the second heating region $HR_2$ is driven, the switches SW2 and SW3 of the selection switch SW are turned on, while the other switches SW1 and SW4 to SW8 are turned off. The heating control unit 138 outputs an arbitrary manipulated variable in synchronism with the timing at which the heating region that receives a manipulated variable is switched at a predetermined time interval. For example, the heating control unit 138 sequentially selects heating regions that receive manipulated variables at a predetermined time interval to set the heating times in which the first heating region $HR_1$ to seventh heating region $HR_7$ heat the liquid LQ to predetermined times. The heating control unit 138 then changes the manipulated variable input to the heating region selected by the selection switch SW to, in turn, change the amounts of heat applied to the liquid LQ by the first heating region $HR_1$ to seventh heating region $HR_7$ per unit time within a predetermined time. With this operation, the heating unit 136 can form an arbitrary heat amount distribution (see FIGS. 10A and 10B), as described above.

Instead of changing the manipulated variable input to the heating region, the time in which the heating region is selected (that is, the time in which the manipulated variable is input) may be changed. For example, the heating control unit 138 maintains constant the manipulated variables input to the heating regions selected by the selection switch SW, that is, the amounts of heat applied to the liquid LQ by the first heating region $HR_1$ to seventh heating region $HR_7$ per unit time. The heating control unit 138 uses the selection switch SW to change the time in which a heating region is selected to change the heating time in which each of the first heating region $HR_1$ to seventh heating region $HR_7$ heats the liquid LQ. In this case as well, the heating unit 136 can form an arbitrary heat amount distribution (see FIGS. 10A and 10B), as described above.

Increases in the number of wiring lines connected to the heating unit 136, and the number of drivers for supplying currents to the heating unit 136 can be suppressed using the driving circuit 500, as shown in FIG. 11, even if the heating unit 136 includes a plurality of heating regions.

As in this embodiment, in open control of the heating unit 136, a voltage or current driver, if used, has a resistance value that changes due to heat generated by itself. When this occurs, an error that depends on the temperature coefficient of a resistor material occurs in the amount of heat applied to the liquid LQ by the heating unit 136 (each heating region). Hence, if a voltage driver is used, a detection circuit which detects a current value applied to the heating unit 136 need only be used to perform feedback control in consideration of the resistances of portions other than heating elements, such as wiring lines. However, if a current driver is used, a voltage value applied to the heating unit 136 need only be detected to perform feedback control.

Also, the heating control unit 138 may perform feedback control such as PID based on the detection results obtained by the detection units 152a, 152b, 152c, and 152d. In this case, it is necessary to arrange a large number of detection units by pairing the detection units 152 with a plurality of heating regions included in the heating unit 136. If it is difficult to arrange a large number of detection units, one detection unit 152 need only be disposed for some of the plurality of heating regions to predict (interpolate) the temperature of a heating region from the difference between the detection results obtained by adjacent detection units 152. Moreover, a feedback system which uses the detection results obtained by the detection units 152a, 152b, 152c, and 152d, and a feedforward system which uses heat amount information stored in the storage unit 140 may be used in combination for control.

While the liquid LQ is not supplied to the space between the projection optical system 108 and the substrate 110, it does not vaporize (generates no heat of vaporization) in the recovery path 130, so the heating unit 136 does not heat the liquid LQ. In supplying the liquid LQ to the space between the projection optical system 108 and the substrate 110, the heating unit 136 starts to heat the liquid LQ. More specifically, the liquid LQ is heated by a plurality of heating regions included in the heating unit 136 so that the temperature distribution generated in the recovery path 130 becomes a predetermined temperature distribution (so as to form a heat amount distribution shown in FIG. 10A) while the substrate stage 112 stands still. However, when the substrate stage 112 is moved in, for example, transport of the substrate 110 and step movement to each shot region on the substrate 110, the liquid LQ is heated by a plurality of heating regions included in the heating unit 136 so as to form a heat amount distribution shown in, for example, FIG. 10B. At this time, the heat amount distributions to be formed in the recovery path 130 are changed (updated) in a plurality of heating regions, included in the heating unit 136, in accordance with, for example, a change in moving profile of the substrate stage 112.

With this operation, in this embodiment, the heat amount distribution to be formed in the recovery path 130 can be dynamically changed in accordance with whether the substrate stage 112 stands still or moves, or how the substrate stage 112 moves. This makes it possible to reduce the amount of decrease in temperature, especially, temperature variations generated in the recovery path 130, which dynamically change with movement of the substrate stage 112. Note that when the substrate stage 112 is continuously moved at a high velocity, the amount of decrease in temperature is averaged based on the balance between the heat transfer time constant of the recovery path 130, and the repetitive moving velocity in the Y-direction. In such a case, the heat amount distribution to be formed in the recovery path 130 may be changed for each substrate instead of changing it for each moving operation of the substrate stage 112.

As described in each embodiment, the exposure apparatus 1 can reduce the amount of decrease in temperature of the recovery path 130 which recovers the liquid LQ supplied to the space between the projection optical system 108 and the substrate 110, thus reducing the unevenness of the temperature distribution of the portion surrounding the recovery path 130. This means that the exposure apparatus 1 can maintain high pattern transfer accuracy while the projection optical system 108 or laser interferometer 116 disposed around the recovery path 130 is free from the adverse effect of a decrease in temperature of the recovery path 130. Hence, the exposure apparatus 1 according to this embodiment can provide a high-quality device (for example, a semiconductor integrated circuit device or a liquid crystal display device) with a high throughput and good economic efficiency. This device can be fabricated by a step of exposing a substrate coated with a resist using the exposure apparatus 1, a step of developing the exposed substrate, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-104881 filed on May 1, 2012, which is hereby incorporated by reference herein in its entirety.

What is claimed is:

1. An exposure apparatus which includes a projection optical system that projects a pattern of a reticle onto a substrate, and exposes the substrate through the projection optical system and a liquid, the apparatus comprising:
a supply unit which includes a supply path connected to a supply port, and is configured to supply the liquid to a space between the projection optical system and the substrate through the supply port and the supply path;
a recovery unit which includes a recovery path connected to a recovery port, and is configured to recover the liquid, supplied to the space, through the recovery port and the recovery path;
a nozzle member which is disposed around the projection optical system, and includes the supply port and the recovery port formed therein, wherein the supply path includes, in the nozzle member, a supply path which is disposed along a circumference of a circle to surround an optical axis of the projection optical system, and the recovery path includes, in the nozzle member, a recovery path which is disposed outside the supply path along a circumference of a circle to surround the optical axis; and
a heating unit which is disposed along the recovery path, and configured to heat the liquid recovered through the recovery port and the recovery path.

2. The apparatus according to claim 1, further comprising:
a storage unit configured to store a time-series heating profile representing a change in amount of heat, applied to the liquid, over time,
wherein the heating unit heats the liquid in accordance with the heating profile stored in the storage unit.

3. The apparatus according to claim 1, further comprising:
a detection unit configured to detect at least one of a temperature of the liquid recovered by the recovery unit, a temperature of an inner portion of the projection optical system on a side of the substrate, and a temperature of a stage space in which a substrate stage that holds the substrate is disposed; and
a control unit configured to control the heating of the liquid by the heating unit so that a difference between a target temperature and the temperature detected by the detection unit falls within a tolerance.

4. The apparatus according to claim 1, wherein the recovery path includes a first path located inside the nozzle member, and a second path located outside the nozzle member,
wherein the heating unit is disposed along at least one of the first path and the second path.

5. The apparatus according to claim 1, wherein the heating unit includes a plurality of heating regions capable of heating the liquid by different amounts of heat.

6. The apparatus according to claim 5, further comprising:
a stage configured to move upon holding the substrate; and
a determination unit configured to determine amounts of heat, applied to the liquid by the plurality of heating regions, based on at least one of an acceleration, a velocity, an amount of movement, and a moving direction of the stage, so that a temperature distribution generated in the recovery path becomes a predetermined temperature distribution,
wherein the heating unit heats the liquid by the plurality of heating regions in accordance with the amounts of heat determined by the determination unit.

7. The apparatus according to claim 6,
wherein the determination unit determines amounts of heat, applied to the liquid by the plurality of heating regions, based on at least one of a type of water-repellent material applied onto a surface of the substrate, and a type of water-repellent material applied onto a surface of the stage, so that a temperature distribution generated in the recovery path becomes a predetermined temperature distribution.

8. The apparatus according to claim 5, further comprising:
a storage unit configured to store heat amount information indicating amounts of heat, applied to the liquid by the plurality of heating regions, so that a temperature distribution generated in the recovery path becomes a predetermined temperature distribution,
wherein the heating unit heats the liquid by the plurality of heating regions in accordance with the heat amount information stored in the storage unit.

9. The apparatus according to claim 8, further comprising:
a stage configured to move upon holding the substrate,
wherein the stage unit stores the heat amount information for each moving profile of the stage.

10. The apparatus according to claim 5, wherein
heating times in which the plurality of heating regions heat the liquid are set to predetermined times, and
the heating unit changes amounts of heat, applied to the liquid by the plurality of heating regions per unit time within the predetermined times, so that the temperature distribution generated in the recovery path becomes a predetermined temperature distribution.

11. The apparatus according to claim 5, wherein
amounts of heat, applied to the liquid by the plurality of heating regions per unit time, are set constant, and
the heating unit changes heating times, in which the plurality of heating regions heat the liquid, so that the temperature distribution generated in the recovery path becomes a predetermined temperature distribution.

12. The apparatus according to claim 1, wherein the heating unit includes at least one of a sheathed heater, a sheet heater, and a Peltier device.

13. The apparatus according to claim 1, wherein the heating unit comprises an exothermic portion which heats a liquid having contact with the exothermic portion in the recovery path.

14. The apparatus according to claim 1, wherein the heating unit is disposed to directly heat the liquid in the recovery path.

15. The apparatus according to claim 1, wherein the heating unit is disposed on an upper surface of the recovery path facing the recovery port, a side surface of the recovery path along a direction perpendicular to the upper surface, or the upper surface and the side surface.

16. The apparatus according to claim 1, wherein the heating unit heats the liquid recovered in a gas-liquid mixture state.

17. The apparatus according to claim 16,
wherein the recovery unit includes a tank which separates a gas from the liquid recovered in the gas-liquid mixture state and stores the liquid, and a recovery path connecting to the tank, and
the liquid recovered in the gas-liquid mixture state is supplied to the tank via the recovery path.

18. The apparatus according to claim 1, wherein the heating unit has a shape corresponding with a shape of the recovery path.

19. The apparatus according to claim 1, wherein the heating unit includes a smaller cross section in a direction of a surface perpendicular to a direction in which the liquid flows in the recovery path than a cross section of the recovery path in the direction of the surface.

20. The apparatus according to claim 1, wherein the heating unit is continuously disposed along the recovery path.

21. The apparatus according to claim 1, wherein the heating unit is disposed along an entire circumference of the recovery path.

22. The apparatus according to claim 1, wherein a heat insulating material is disposed between the heating unit and the nozzle member.

23. The apparatus according to claim 1, wherein a heat insulating material disposed outside the recovery path.

24. A device fabrication method comprising:
exposing a substrate using an exposure apparatus; and
performing a development process for the substrate exposed,
wherein the exposure apparatus includes a projection optical system that projects a pattern of a reticle onto the substrate, and exposes the substrate through the projection optical system and a liquid, the apparatus comprising:
a supply unit which includes a supply path connected to a supply port, and is configured to supply the liquid to a space between the projection optical system and the substrate through the supply port and the supply path;
a recovery unit which includes a recovery path connected to a recovery port, and is configured to recover the liquid, supplied to the space, through the recovery port and the recovery path;
a nozzle member which is disposed around the projection optical system, and includes the supply port and the recovery port formed therein, wherein the supply path includes, in the nozzle member, a supply path which is disposed along a circumference of a circle to surround an optical axis of the projection optical system, and the recovery path includes, in the nozzle member, a recovery path which is disposed outside the supply path along a circumference of a circle to surround the optical axis; and
a heating unit which is disposed along the recovery path, and configured to heat the liquid recovered through the recovery port and the recovery path.

* * * * *